(12) United States Patent
Murayama

(10) Patent No.: US 11,543,359 B2
(45) Date of Patent: Jan. 3, 2023

(54) MEASURING APPARATUS AND FILM FORMING APPARATUS

(71) Applicant: DEXERIALS CORPORATION, Tokyo (JP)

(72) Inventor: Tetsuya Murayama, Utsunomiya (JP)

(73) Assignee: DEXERIALS CORPORATION, Tochigi (JP)

( * ) Notice: Subject to any disclaimer, the term of this patent is extended or adjusted under 35 U.S.C. 154(b) by 0 days.

(21) Appl. No.: 17/248,173

(22) Filed: Jan. 12, 2021

(65) Prior Publication Data

US 2021/0247322 A1 Aug. 12, 2021

(30) Foreign Application Priority Data

Feb. 12, 2020 (JP) .............................. JP2020-021413

(51) Int. Cl.
*G01N 21/59* (2006.01)
*G01N 21/84* (2006.01)
(Continued)

(52) U.S. Cl.
CPC ......... *G01N 21/8422* (2013.01); *C23C 14/54* (2013.01); *G01N 21/49* (2013.01);
(Continued)

(58) Field of Classification Search
CPC ...... G01M 11/02; G01M 11/00; G01N 21/49; G01N 21/45; G01N 21/86; G01N 21/59;
(Continued)

(56) References Cited

U.S. PATENT DOCUMENTS 2,821,103 A * 1/1958 Blet .................... G01N 21/5907
356/419
3,488,117 A * 1/1970 Weisglass ............ G03B 27/547
355/37
(Continued)

FOREIGN PATENT DOCUMENTS

JP 62228946 A 10/1987
JP 2000199731 A 7/2000
(Continued)

OTHER PUBLICATIONS

"Japanese Application Serial No. 2020-021413, Decision to Grant dated Jul. 14, 2020", w/ English Translation, (Jul. 14, 2020), 5 pgs.
(Continued)

*Primary Examiner* — Isiaka O Akanbi
(74) *Attorney, Agent, or Firm* — Schwegman Lundberg & Woessner, P.A.

(57) ABSTRACT

Provided is a measuring apparatus, comprising a measuring unit that irradiates a film with light and measures the light transmitted through the film or the light reflected by the film, a moving mechanism that allows the measuring unit to move in a first direction intersecting the direction in which the film is conveyed, the measuring unit includes a light projecting unit that irradiates the film with light, an integrating sphere that collects light from the film, and a light receiving portion that receives the light collected by the integrating sphere.

9 Claims, 6 Drawing Sheets

(51) Int. Cl.
*C23C 14/54* (2006.01)
*H01J 37/34* (2006.01)
*G01N 21/49* (2006.01)

(52) U.S. Cl.
CPC .......... *G01N 21/59* (2013.01); *H01J 37/3476* (2013.01); *G01N 2021/8427* (2013.01)

(58) Field of Classification Search
CPC ....... G01N 21/8422; G01N 2021/8427; G01N 21/474; C23C 14/54; H01J 37/3476
USPC .......................... 356/446, 432, 236, 402, 218
See application file for complete search history.

(56) References Cited

U.S. PATENT DOCUMENTS

| | | | | |
|---|---|---|---|---|
| 4,160,646 A * | 7/1979 | Furutani | ............ | G01N 21/8483 436/163 |
| 4,703,187 A | 10/1987 | Hoefling et al. | | |
| 4,873,430 A * | 10/1989 | Juliana | ................ | G01B 11/065 250/225 |
| 4,963,743 A * | 10/1990 | Satake | ............... | G01N 21/4738 250/339.07 |
| 5,182,618 A * | 1/1993 | Heinonen | ............ | G01N 21/474 250/228 |
| 6,275,295 B1 * | 8/2001 | Sopori | ................. | G01N 21/474 356/236 |
| 2004/0223149 A1 * | 11/2004 | Skierski | ................. | G01N 33/46 356/300 |
| 2007/0046944 A1 * | 3/2007 | Ghil | ..................... | G01N 21/958 356/446 |
| 2011/0007320 A1 * | 1/2011 | Krauss | ..................... | G01J 3/10 356/446 |
| 2011/0128540 A1 * | 6/2011 | Iida | ........................... | G01J 1/12 356/319 |
| 2012/0182545 A1 * | 7/2012 | Proehl | ................ | G01N 21/8422 356/73 |
| 2012/0314208 A1 * | 12/2012 | Margraf | ............... | G01N 21/896 356/73 |
| 2013/0248737 A1 * | 9/2013 | Iguchi | ................. | G01N 21/645 250/458.1 |
| 2013/0313444 A1 * | 11/2013 | Simonian | ................ | G01N 21/64 250/459.1 |
| 2014/0141540 A1 * | 5/2014 | Abe | ........................ | H01L 22/26 438/7 |
| 2015/0260648 A1 * | 9/2015 | Xu | ........................ | G01N 21/59 250/206 |
| 2015/0346096 A1 | 12/2015 | Suzuki et al. | | |
| 2015/0369727 A1 * | 12/2015 | Sugioka | ................. | G01N 33/06 356/442 |
| 2017/0088941 A1 * | 3/2017 | Schroeder | .............. | G01N 21/93 |
| 2018/0364160 A1 | 12/2018 | Aben et al. | | |

FOREIGN PATENT DOCUMENTS

| | | |
|---|---|---|
| JP | 2002236076 A | 8/2002 |
| JP | 2008049604 A | 3/2008 |
| WO | WO-2017213001 A1 | 12/2017 |

OTHER PUBLICATIONS

"Japanese Application Serial No. 2020-021413, Office Action dated Mar. 24, 2020", w/ English Translation, (Mar. 24, 2020), 9 pgs.

"Japanese Application Serial No. 2020-136715, Notice of Submission of Publications dated Jun. 7, 2022", w/ English Translation, (Jun. 7, 2022), 21 pgs.

"Paper and board-Measurement of 75° specular gloss-Converging beam method", JIS P 8142, (2005), 22 pgs.

* cited by examiner

MEASURING APPARATUS AND FILM FORMING APPARATUS

CLAIM FOR PRIORITY

Priority is claimed on Japanese Patent Application No. 2020-021413, filed Feb. 12, 2020, the contents of which are incorporated herein by reference.

TECHNICAL FIELD

The present invention relates to a measuring apparatus, and a film forming apparatus.

BACKGROUND ART

There is known an optical film in which a thin film is formed on the surface of the film by vapor deposition, sputtering, or the like to impart a function such as antireflection. Since the characteristics of the optical film vary depending on the film forming conditions of the thin film and the like, it is required to accurately evaluate the thin film to be formed.

For example, Patent Literature 1 describes an optical characteristic measuring apparatus that has a means for collecting a diffuse reflection surface having a spherical inner peripheral surface and evaluates a film to be conveyed. Further, Patent Literature 2 describes an optical characteristic measuring apparatus capable of evaluating a flat substrate placed on a stage in situ.

CITATION LIST

Patent Literatures

[Patent Literature 1]
Japanese Unexamined Patent Application, First Publication No. 2000-199731
[Patent Literature 2]
Japanese Unexamined Patent Application, First Publication No. 2002-236076

SUMMARY OF INVENTION

Technical Problem

However, the optical characteristic measuring apparatus described in Patent Literatures 1 and 2 cannot evaluate an arbitrary part of the film. For example, when there is unevenness in the optical characteristics in the width direction of the film, the unevenness in the optical characteristics cannot be detected.

The present invention has been made in view of the above problems, and an object of the present invention is to provide a measuring apparatus and a film forming apparatus capable of measuring optical characteristics of an arbitrary portion of a conveyed film with high accuracy.

Solution to Problem

The present invention provides the following means for solving the above problems.

According to the first aspect of the present invention, there is a provided a measuring apparatus, comprising a measuring unit that irradiates a film with light and measures the light transmitted through the film or the light reflected by the film, a moving mechanism that allows the measuring unit to move in a first direction intersecting the direction in which the film is conveyed, the measuring unit includes a light projecting unit that irradiates the film with light, an integrating sphere that collects light from the film, and a light receiving portion that receives the light collected by the integrating sphere.

In the measuring apparatus according to the above aspect, the integrating sphere may not be in contact with the film.

In the measuring apparatus according to the above aspect, the illuminance of the external light applied to the opening surface of the integrating sphere may be 1.0 Lux or less.

The measuring apparatus according to the above aspect may further comprises a support that supports the film from the side opposite to the light irradiation surface of the film, wherein the reflectance of the support is 1.0% or less.

The measuring apparatus according to the above aspect may further comprises a calibration plate on the side of the film in the first direction.

According to the first aspect of the present invention, there is a provided a film forming apparatus, comprising a film forming unit that forms a film in a vacuum, a measuring apparatus according to the first aspect of the present invention, that measures the optical characteristics of the film formed in the film forming unit, a spectrometer that disperses the light received by the light receiving portion of the measuring apparatus, a calculation unit that evaluates the formed film based on the measurement results of the spectrometer and feeds back the film forming conditions to the film forming unit.

Advantageous Effects of Invention

According to the measuring apparatus and the film forming apparatus according to the above aspect, the optical characteristics of an arbitrary portion of the conveyed film can be measured with high accuracy.

DESCRIPTION OF EMBODIMENTS

Hereinafter, the present embodiments will be described in detail with appropriate reference to the drawings. The drawings used in the following description may sometimes be drawn with specific portions enlarged to facilitate comprehension of the features of the present invention, and the dimensional ratios and the like between the constituent elements may differ from the actual values. The materials and dimensions and the like presented in the following description are merely examples, which in no way limit the present invention, and may be altered as appropriate within the scope of the present invention.

[Film Forming Apparatus]

Figure 1:
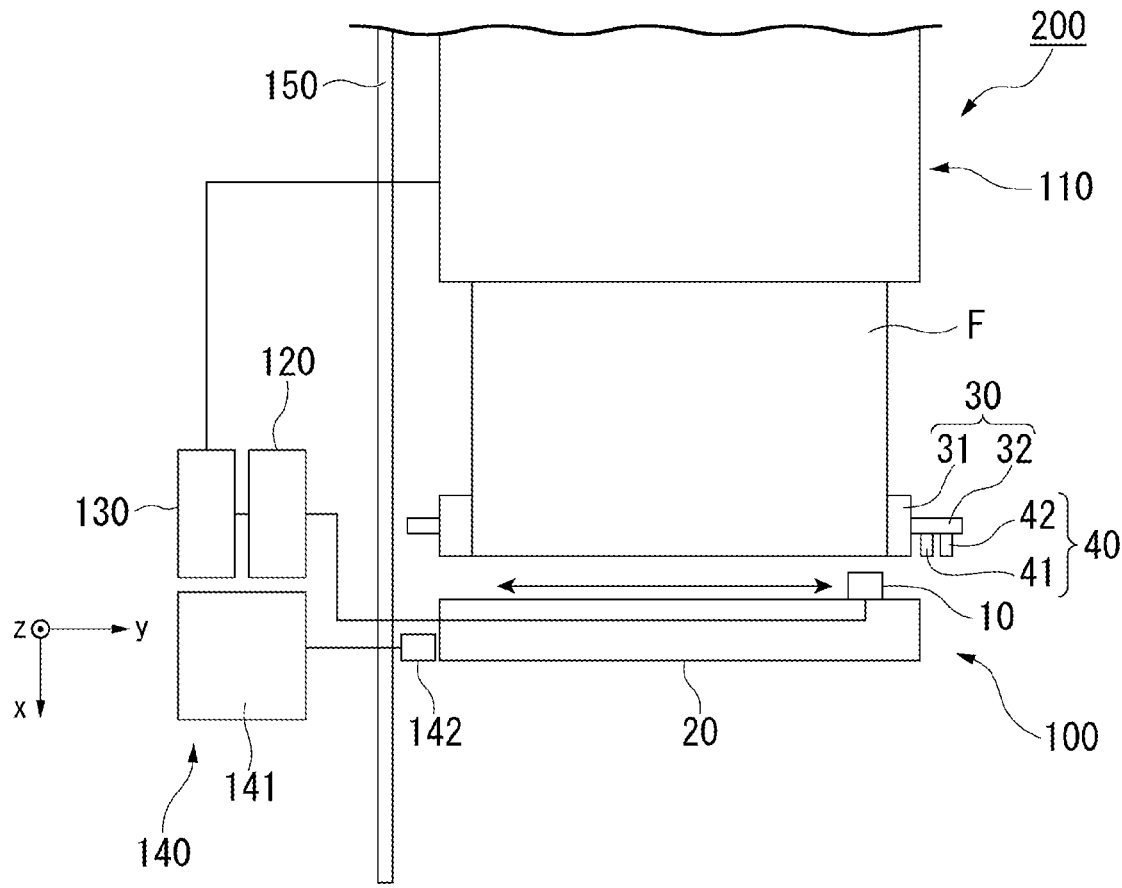
FIG. 1 is a schematic diagram of the film forming apparatus according to a first embodiment.

FIG. 1 is a schematic diagram of the film forming apparatus 200 according to the first embodiment. The film forming apparatus 200 includes a measuring apparatus 100, a film forming unit 110, a spectrometer 120, a calculation unit 130, and a driving device 140. The film forming apparatus 200 extends to, for example, a vacuum environment and an atmospheric environment separated by a partition wall 150. The measuring apparatus 100 and the film forming unit 110 are in a vacuum environment. For example, the spectrometer 120 and the calculation unit 130 are in an atmospheric environment. For example, the driving device 140 is in a vacuum environment and in an atmospheric environment.

The film forming unit 110 laminates a functional film on the surface of the film F. The functional film is, for example, an antireflection film in which a plurality of dielectric layers are laminated. The film forming unit 110 laminates a functional film on the surface of the film F by, for example, a vapor deposition method, a sputtering method, or the like.

The film F on which the functional films are laminated is conveyed to the measuring apparatus 100. Hereinafter, the transport direction of the film F from the film forming unit 110 to the measuring apparatus 100 is referred to as the x direction, the width direction of the film F is referred to as the y direction, and the directions orthogonal to the x direction and the y direction are referred to as the z direction. The measuring apparatus 100 measures the optical characteristics of the film F. Details of the measuring apparatus 100 will be described later.

The driving device 140 moves the measuring unit 10 in they direction by the moving mechanism 20. By moving the measuring unit 10 in the y direction, the measuring unit 10 can be moved to an arbitrary position of the film F, and the optical characteristics of the film F at an arbitrary position can be measured. The driving device 140 includes, for example, a control unit 141 and a motor 142. The control unit 141 controls the motor 142.

The measurement result of the film F is sent from the measuring unit 10 to the spectrometer 120 via, for example, an optical fiber. The spectrometer 120 obtains a spectrum of transmitted light from the film F or reflected light from the film F. The obtained spectrum is sent to the calculation unit 130.

The calculation unit 130 calculates the optical characteristics of the functional film from the spectrum actually measured by the measurement unit 10. The calculation unit 130 feeds back the film forming conditions in the film forming unit 110 based on the calculated optical characteristics. If the calculated optical characteristics are different from the design characteristics, the film forming conditions in the film forming unit 110 are changed.

[Measuring Apparatus]

The measuring apparatus 100 includes, for example, a measuring unit 10, a moving mechanism 20, a support 30, and a calibration plate 40. The measuring unit 10 can be moved in the y direction by the moving mechanism 20. The support 30 faces the measuring unit 10. The calibration plate 40 is on the side of the support 30 in the y direction.

Figure 2:
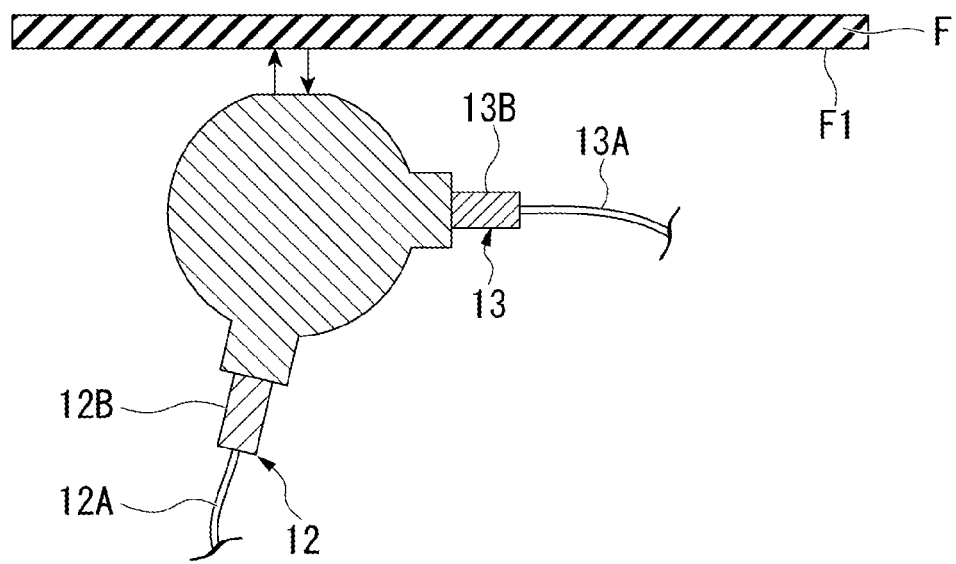
FIG. 2 is an enlarged view of the measuring unit of the measuring apparatus according to a first embodiment.

FIG. 2 is an enlarged view of the measuring unit 10 of the measuring device 100 according to the first embodiment. The measuring unit 10 includes at least an integrating sphere 11, a light projecting optical fiber 12, and a light receiving optical fiber 13. The light projecting optical fiber 12 is connected to a light source. The light receiving optical fiber 13 is connected to the spectrometer 120. The light projecting optical fiber 12 and the light receiving optical fiber 13 have, for example, bendable fibers 12A and 13A and fixing portions 12B and 13B, respectively. The fixing portions 12B and 13B are, for example, screwed to the housing 15. By firmly fixing the non-bending fixing portions 12B and 13B to the integrating sphere 11, even if the measuring unit 10 moves, the influence of vibration can be suppressed. The measuring unit 10 irradiates the film F with light and measures the light transmitted or reflected from the film F.

The size of the integrating sphere 11 is not particularly limited. The diameter of the integrating sphere 11 can be, for example, arbitrarily selected as long as it does not interfere with the operation of the moving mechanism 20 described later.

The integrating sphere 11 is not limited to the case where it is directly fixed to the moving mechanism 20. For example, the integrating sphere 11 may be installed in a separately provided housing and fixed to the moving mechanism 20 via the housing.

The integrating sphere 11 is not limited to the case where it is directly fixed to the moving mechanism 20. For example, the integrating sphere 11 may be installed in a separately provided housing and fixed to the moving mechanism 20 via the housing.

Figure 3:
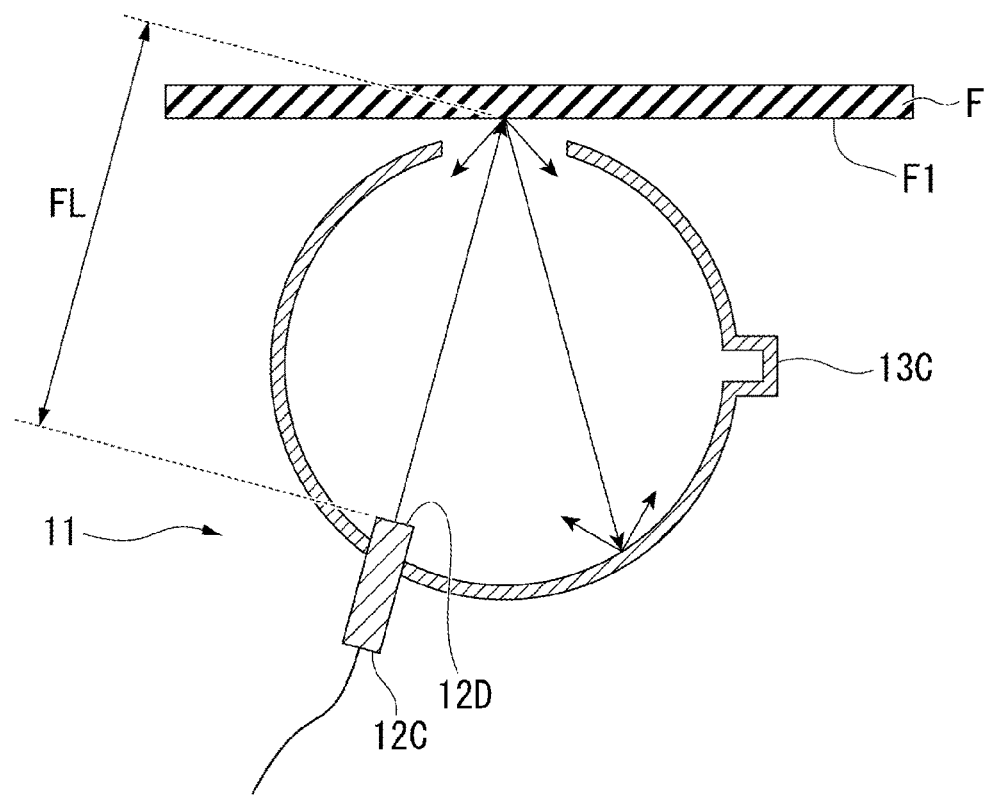
FIG. 3 is an enlarged view near the integrating sphere of the measuring apparatus according to a first embodiment.

FIG. 3 is an enlarged view of the integrating sphere 11. The light projecting unit 12C and the light receiving portion 13C are connected to the integrating sphere 11. The light projecting unit 12C is a part of the light projecting fiber 12. The light receiving portion 13C is a part of the light receiving fiber 13. The inner wall of the integrating sphere 11 is coated with a coating having high reflectance and excellent diffusion characteristics. The integrating sphere 11 is, for example, non-contact with the film F and does not damage the film F.

The light projecting unit 12C irradiates the film F with light. The light irradiated to the light irradiation surface F1 of the film F is diffusely reflected by the light irradiation surface F1. The diffusely reflected light hits the inner wall of the integrating sphere 11 and repeats diffuse reflection. The integrating sphere 11 collects the light from the film F. The light receiving portion 13C repeatedly diffuses and reflects light in the integrating sphere 11 to receive light having a substantially uniform brightness. The light receiving portion 13C receives the light collected by the integrating sphere 11. The received light contains a specular reflection component and a diffuse reflection component on the light irradiation surface F1.

The light projecting unit 12C includes, for example, a condenser lens 12D. The distance FL between the condenser lens 12D and the light irradiation surface F1 of the film F deviates, for example, from the focal length of the condenser lens 12D. The distance FL between the condenser lens 12D and the light irradiation surface F1 of the film F is, for example, shorter than the focal length of the condenser lens 12D. By bringing the condenser lens 12D closer to the film F, the irradiation spot size of the light irradiation surface F1 becomes larger. The irradiation spot size is, for example, 5 mm φ. When the irradiation spot size is increased, the measurement surface is averaged and stable measurement is possible even if there are large diffusion components of light reflected from the light irradiation surface F1. Further, by bringing the condenser lens 12D closer to the film F, the light projecting optical fiber 12 can be brought closer to the film F side, and the measuring unit 10 is miniaturized.

Figure 4:
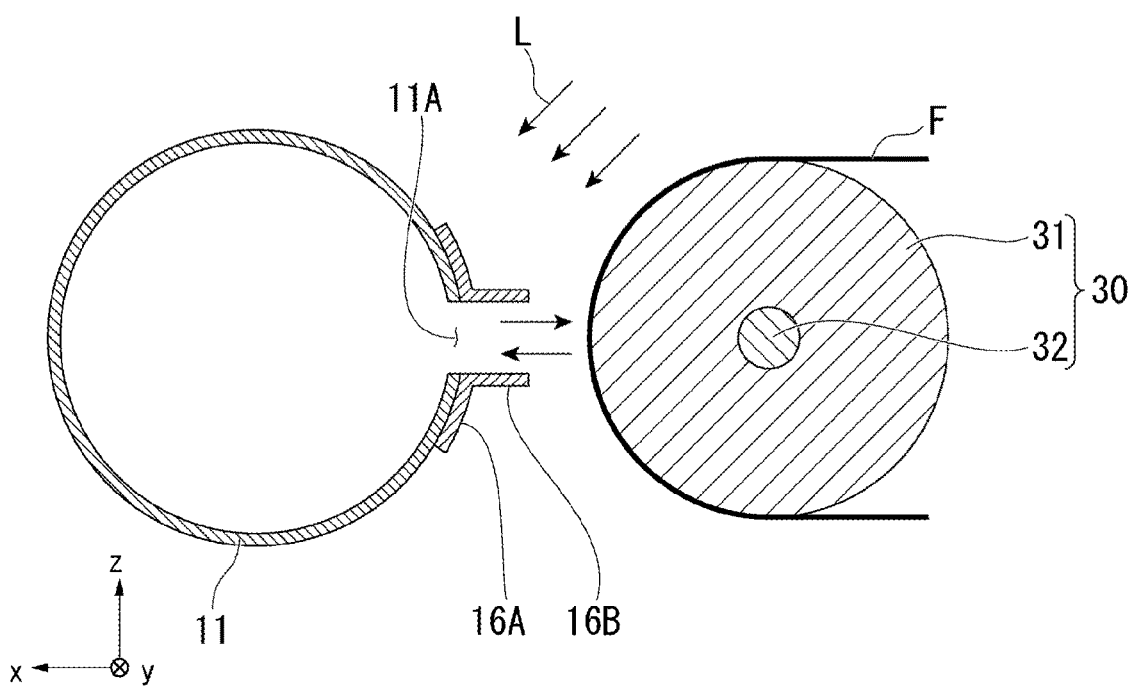
FIG. 4 is a cross-sectional schematic diagram in the vicinity of the measuring unit of the measuring apparatus according to a first embodiment.

Further, FIG. 4 is an enlarged view of the vicinity of the measuring unit 10 of the measuring device 100 according to the first embodiment. The measuring unit 10 may have a shielding member 16 that surrounds the opening surface 11A of the integrating sphere 11. The shielding member 16 shields the external light L from entering the integrating sphere 11. The external light L causes disturbance of the measurement data. For example, the shielding member 16 sets the illuminance of the external light L applied to the opening surface 11A of the integrating sphere 11 to 1.0 Lux or less.

The shielding member 16 has, for example, a support portion 16A and a shielding portion 16B. The support portion 16A supports the shielding portion 16B. The support portion 16A extends along the outer surface of the integrating sphere 11. The shielding portion 16B shields the external light L from entering the integrating sphere 11. For example, the shielding portion 16B stands up from the outer surface of the integrating sphere 11. For example, the area of the region surrounded by the shielding portion 16B may become smaller toward the film F. By reducing the inner diameter of the shielding portion 16B toward the film F, it is possible to further suppress the incident light L on the integrating sphere 11. Further, for example, a part of the shielding portion 16B may be maintained at a certain distance from the film F and may extend along the film F.

Figure 5:
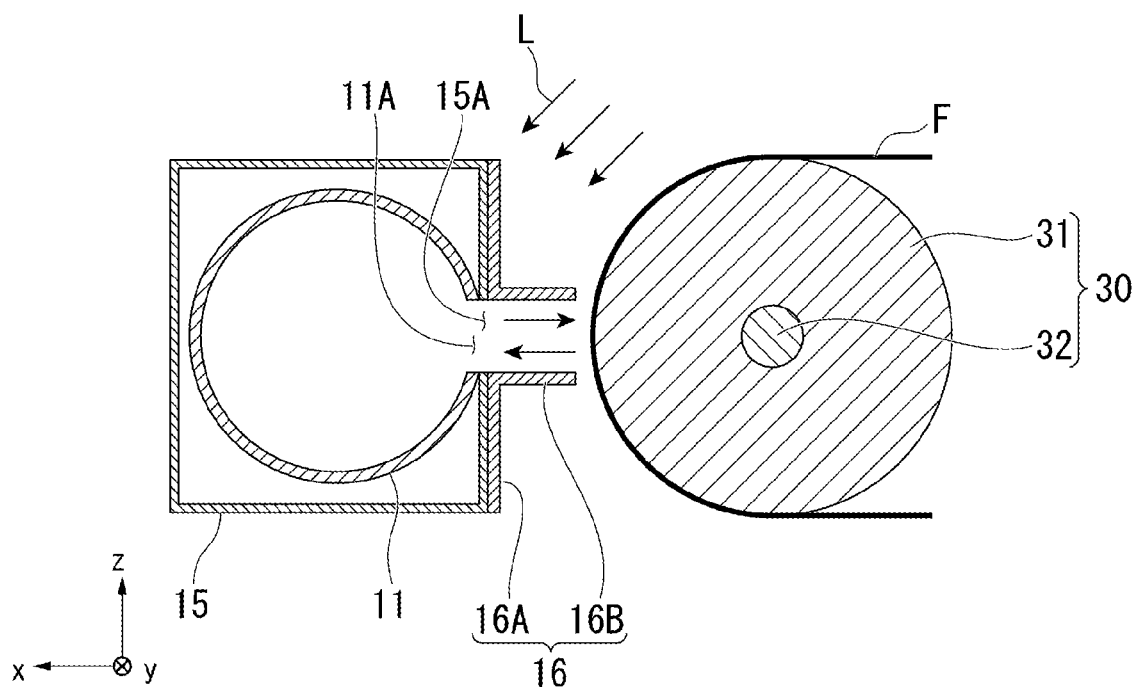
FIG. 5 is a cross-sectional schematic diagram of another example in the vicinity of the measuring unit of the measuring apparatus according to a first embodiment.

Further, as shown in FIG. 5, a shielding member 16 may be provided in the housing 15 surrounding the integrating sphere 11. The shielding member 16 is not directly provided on the integrating sphere 11. For example, when the integrating sphere 11 is provided in the housing 15, the shielding member 16 is provided around the opening 15A of the housing 15.

Figure 6:
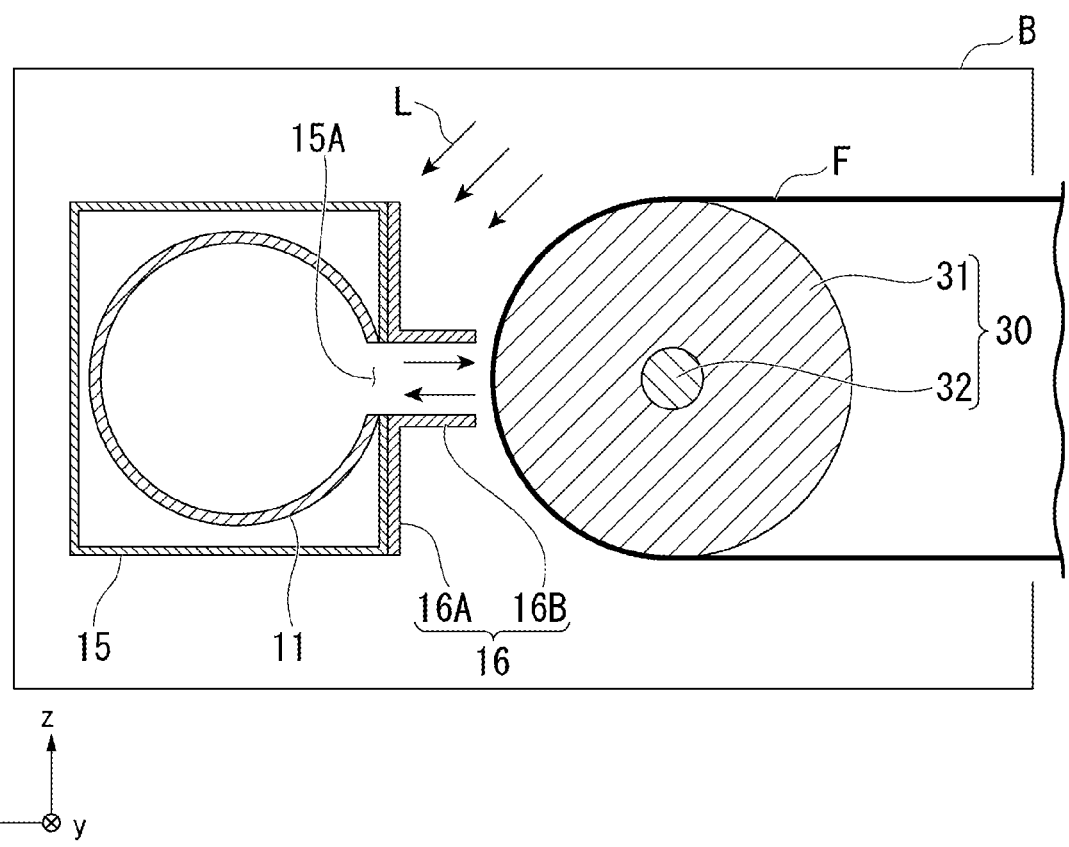
FIG. 6 is a cross-sectional schematic diagram of the other example in the vicinity of the measuring unit of the measuring apparatus according to a first embodiment.

The means for reducing the external light L entering the integrating sphere 11 is not limited to the shielding member 16. For example, the entire vacuum environment surrounded by the partition wall 150 may be darkened. Further, for example, as shown in FIG. 6, an enclosure B surrounding the measuring unit 10 and the support 30 may be provided. The illuminance of the external light applied to the opening surface 15A of the housing 15 is, for example, preferably 1.0 Lux or less, and more preferably 0.3 Lux or less.

The moving mechanism 20 moves the measuring unit 10 in the y direction. The measuring unit 10 can move, for example, in the width direction of the film F, across the first calibration plate 41 and the second calibration plate 42. The moving mechanism 20 is, for example, a linear motion mechanism in the y direction. The moving mechanism 20 is, for example, a linear actuator or a ball screw.

Figure 7:
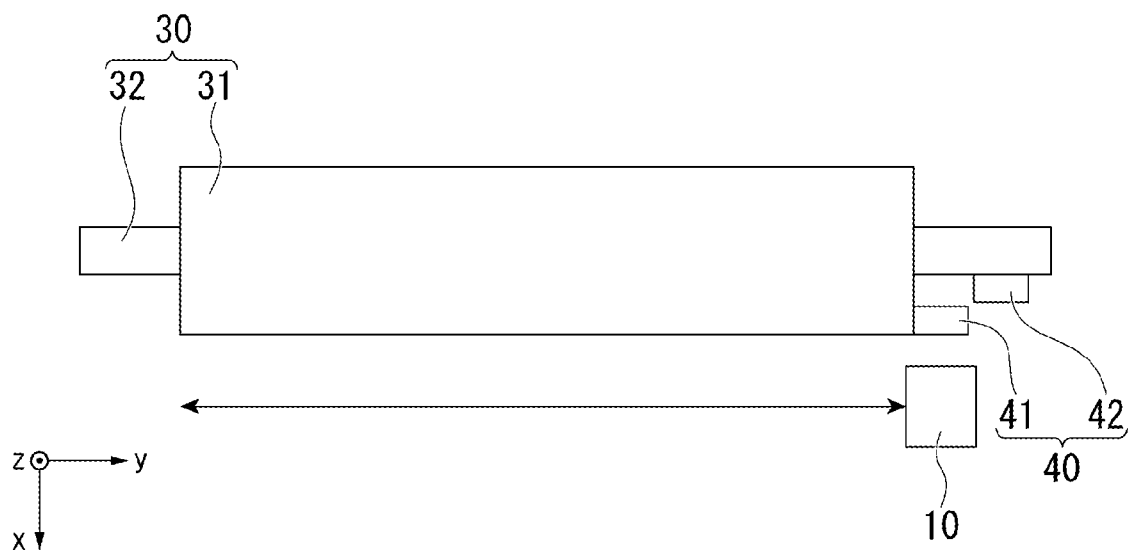
FIG. 7 is a schematic diagram of the support and the calibration plate of the measuring apparatus according to a first embodiment.
Figure 8A:
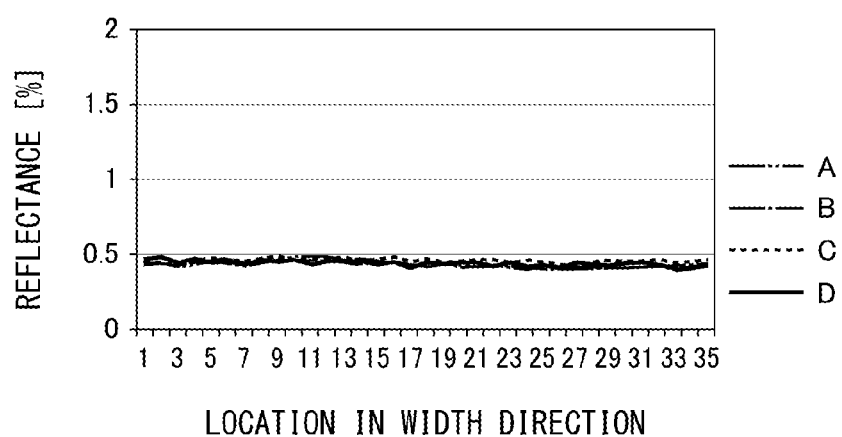
FIG. 8A is a graph which shows the reflectance of the rubber roll before use.
Figure 8B:
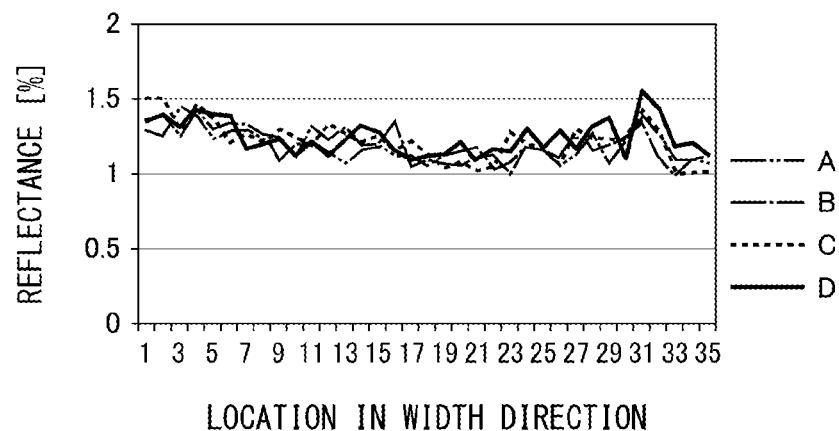
FIG. 8B is a graph which shows the reflectance of the rubber roll after use.
Figure 8C:
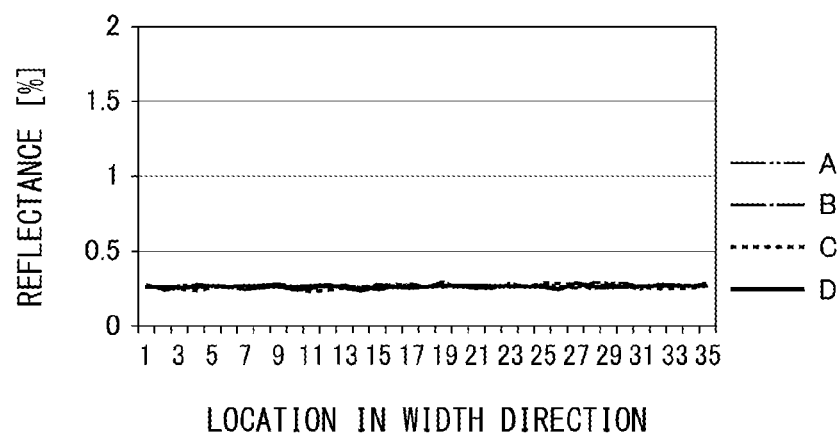
FIG. 8C is a graph which shows the reflectance of the metal black roll before use.
Figure 8D:
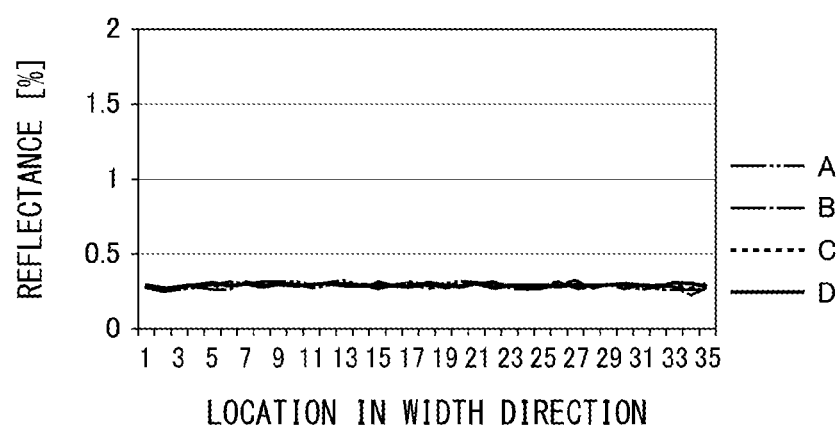
FIG. 8D is a graph which shows the reflectance of the metal black roll after use.

FIG. 7 is a schematic diagram of the support 30 and the calibration plate 40 of the measuring apparatus 100 according to the first embodiment. The support 30 has, for example, a roll 31 and an axis 32. The roll 31 extends in the y direction and rotates about the axis 32. The film F is conveyed along the outer surface of the roll 31.

The roll 31 has, for example, a reflectance of 1.0% or less, preferably less than 0.4%. Since the reflectance of the roll 31 is low, it is possible to suppress the light emitted from the light projecting fiber 12 to the film F from being reflected on the surface of the roll 31. The reflected light from the surface of the roll 31 is reflected from other than the film F to be measured, and contributes to the external light L.

The roll 31 is, for example, a black rubber roll or a metal roll. The roll 31 is preferably, for example, a metal black roll. The metal black roll is, for example, an alumite-treated metal roll, a chrome metal roll, or a black-plated metal roll. The plating is, for example, chrome plating, zinc plating, or nickel plating.

FIG. 8 is a graph showing the transition of the reflectance of the roll. FIG. 8A shows the reflectance of the rubber roll before use, FIG. 8B shows the reflectance of the rubber roll after use, and FIG. 8C shows the reflectance of the metal black roll before use, and FIG. 8D shows the reflectance of the metal black roll after use. After use is, for example, a rubber roll or a black roll after transporting the film F for 400,000 meters. The horizontal axis of the graph is the position of the roll 31 in the y direction, and the vertical axis is the reflectance of four different points (A, B, C, D) in the circumferential direction of the roll 31. The four different points (A, B, C, D) are offset by 90° about the axis 32 of the roll 31.

As shown in FIG. 8, the rubber roll has an average reflectance of 0.45 before use, and the average reflectance after use increases to 1.22. On the other hand, the metal black roll has an average reflectance of 0.27 before use and an average reflectance of 0.29 after use. The metal black roll has a small change in reflectance and enables stable measurement. Further, the metal black roll has less adhesion of the film-forming debris and can reduce the adverse effect on the film F.

Further, the axis 32 also has, for example, a reflectance of 1.0% or less, preferably less than 0.4%. By reducing the reflectance of the axis 32, the external light L incident on the integrating sphere 11 can be reduced. The axis 32 is, for example, a metal whose surface is black-processed.

Figure 9:
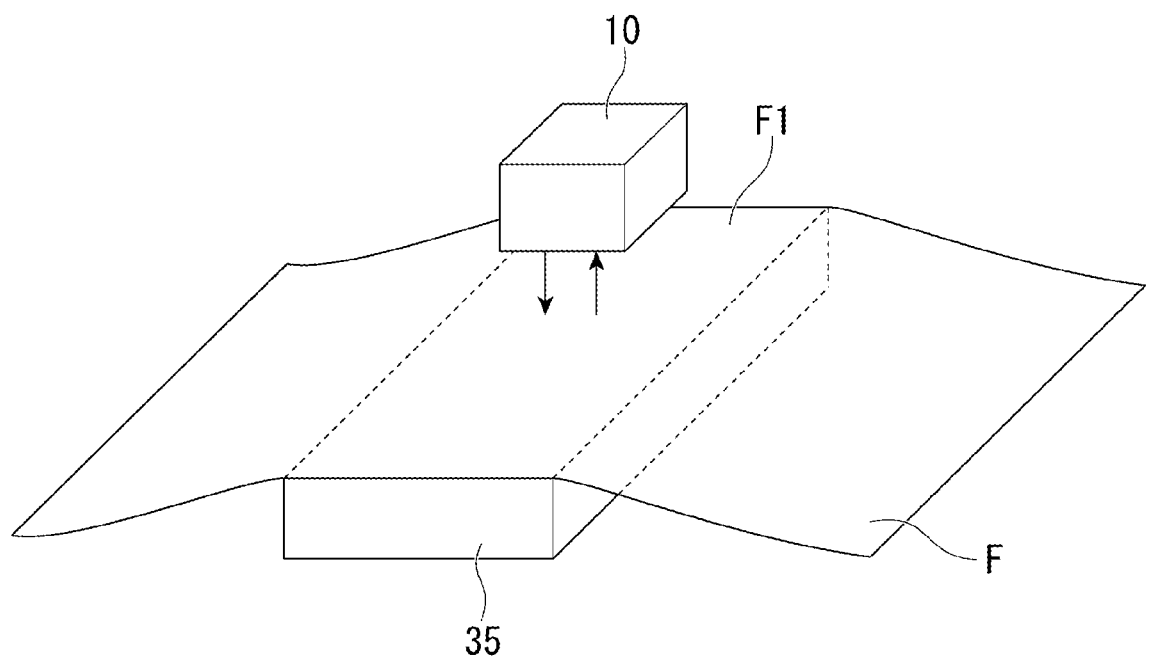
FIG. 9 is a schematic diagram of another example of the support of the measuring apparatus according to a first embodiment.

FIG. 8 shows an example in which the support 30 has a roll 31, but the support is not limited to this example. For example, FIG. 9 is a schematic diagram of another example of the support of the measuring apparatus according to the first embodiment. The support 35 shown in FIG. 9 supports the light irradiation surface F1 of the film F from the surface opposite to the light irradiation surface F1. The support 35 has, for example, a reflectance of 1.0% or less, preferably less than 0.4%.

The calibration plate 40 has, for example, a first calibration plate 41 and a second calibration plate 42 (see FIG. 7). The first calibration plate 41 and the second calibration plate 42 are, for example, on the side of the film F to be conveyed in the y direction. The first calibration plate 41 is a standard reflector for reference measurement. The second calibration plate 42 is for dark measurement.

By separately providing the second calibration plate 42, dark measurement can be performed in an environment substantially similar to the measurement environment of the film F.

By installing the first calibration plate 41 and the second calibration plate 42 on the side of the film F, it becomes easy to perform calibration regularly. For example, the case of a long film formed by roll-to-roll, the calibration may be disturbed when various conditions such as temperature change, and periodic calibration is important.

Figure 10:
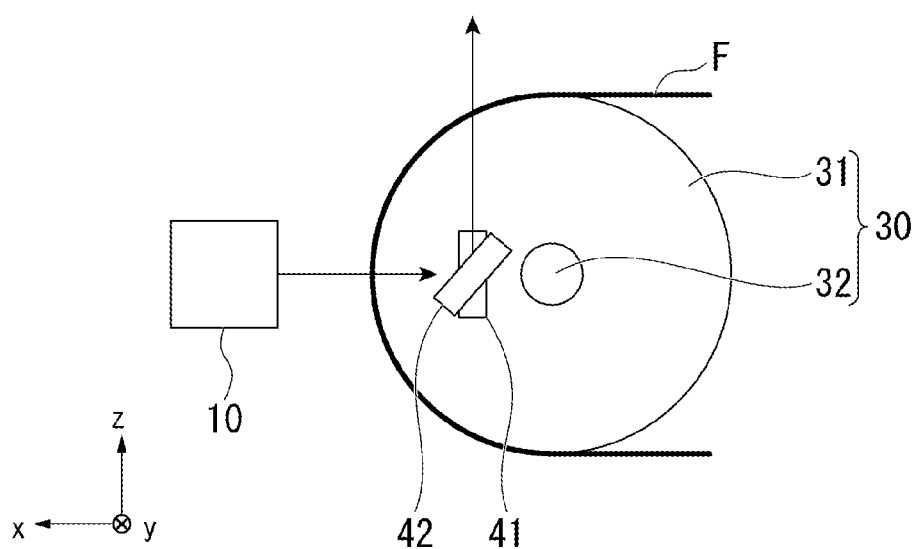
FIG. 10 is a side view of another example of the calibration plate of the measuring apparatus according to a first embodiment.

FIG. 10 is a side view of the calibration plate 40 of the measuring apparatus 100 according to the first embodiment. The first calibration plate 41 is orthogonal to the irradiation direction of the light from the measuring unit 10. The irradiation direction of the light from the measuring unit 10 is, for example, a direction orthogonal to the opening surface 15A of the housing 15. The second calibration plate 42 is tilted with respect to a virtual surface orthogonal to the irradiation direction of light from the measuring unit 10. By tilting the second calibration plate 42 with respect to the virtual surface, it is possible to prevent the reflected light from the second calibration plate 42 from returning to the measuring unit 10, and the influence of the external light L can be further reduced.

As described above, according to the measuring device 100 according to the first embodiment, it is possible to measure the optical characteristics of an arbitrary portion of the conveyed film with high accuracy. Further, according to the film forming apparatus 200 according to the first embodiment, the optical characteristics of the film F can be measured even during the manufacturing process, and the result can be fed back to the film forming conditions in the film forming unit 110.

Further, in the case of a wide film F, the film forming conditions may vary depending on the location in the width direction. Since the measuring unit 10 can move in the width direction of the film F, it is possible to evaluate variations in film forming conditions in the width direction. Further, by feeding back the evaluation result to the film forming unit 110, it is possible to change the film forming conditions for each position in the width direction of the film F, and it is possible to produce a film having more uniform optical characteristics.

REFERENCE SIGNS LIST

10 measuring unit
11 integrating sphere
11A opening surface
12 light projecting optical fiber
13 light receiving optical fiber
12A, 13A bendable fiber
12B, 13B fixing portions
12C light projecting unit
13C light receiving portion
12 D condenser lens
15 housing
16 shielding member
16A support portion
16B shielding portion
20 moving mechanism
30, 35 support
31 roll
32 axis
40 calibration plate
41 first calibration plate
42 second calibration plate
100 measuring apparatus
110 film forming unit
120 spectrometer
130 calculation unit
140 driving device
141 control unit
142 motor
150 partition wall
200 film forming apparatus

The invention claimed is:

1. A measuring apparatus, comprising:
   a measuring unit that irradiates a film with light and measures the light transmitted through the film or the light reflected by the film,
   a moving mechanism that allows the measuring unit to move in a first direction intersecting the direction in which the film is conveyed,
   a metal roll that supports the film from the side opposite to the light irradiation surface of the film,
   the measuring unit includes a light projecting unit that irradiates the film with light, an integrating sphere that collects light from the film, and a light receiving portion that receives the light collected by the integrating sphere, and
   the measuring unit further includes a shielding member that is placed in an area around an opening of the integrating sphere outside the integrating sphere, wherein the shielding member has an L-shaped shielding portion which surrounds the opening of the integrating sphere, stands up from an outer surface of the integrating sphere, and the shielding portion extends between the integrating sphere and the film placed on the metal roll, and wherein the shielding member includes a support portion which extends along an outer surface of the integrating sphere.

2. The measuring apparatus according to claim 1, wherein the integrating sphere is not in contact with the film.

3. The measuring apparatus according to claim 1, wherein an illuminance of an external light applied to the opening surface of the integrating sphere is 1.0 Lux or less.

4. A measuring apparatus according to claim 1, wherein a reflectance of the metal roll is 1.0% or less.

5. A measuring apparatus according to claim 1, wherein the light projecting unit includes a condenser lens, the distance between the condenser lens and the light irradiation surface of the film deviates from the focal length of the condenser lens.

6. A measuring apparatus according to claim 1, further comprising: a calibration plate on the side of the film in the first direction.

7. A film forming apparatus, comprising:
   a film forming unit that forms a film in a vacuum,
   a measuring apparatus according to claim 1, that measures the optical characteristics of the film formed in the film forming unit,
   a spectrometer that disperses the light received by the light receiving portion of the measuring apparatus,
   a calculation unit that evaluates the formed film based on the measurement results of the spectrometer and feeds back the film forming conditions to the film forming unit.

8. A measuring apparatus according to claim 1, further comprising a housing surrounding the integrating sphere, the shielding member is provided at the housing.

9. A measuring apparatus according to claim 1, wherein an exit surface of the light projecting unit that emits light faces the opening of the integrating sphere.

* * * * *